(12) United States Patent
Liu et al.

(10) Patent No.: US 12,301,173 B2
(45) Date of Patent: *May 13, 2025

(54) DEVICE AND METHOD FOR DOWNLINK GAIN COMPENSATION AS WELL AS RADIO UNIT COMPRISING THE DEVICE

(71) Applicant: Telefonaktiebolaget LM Ericsson (publ), Stockholm (SE)

(72) Inventors: Peng Liu, Beijing (CN); Yahui Liu, Beijing (CN); Junfeng Jie, Beijing (CN); Gan Wen, Beijing (CN); Guangfeng Liu, Beijing (CN)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 498 days.

This patent is subject to a terminal disclaimer.

(21) Appl. No.: 17/712,345

(22) Filed: Apr. 4, 2022

(65) Prior Publication Data
US 2022/0224291 A1 Jul. 14, 2022

Related U.S. Application Data

(63) Continuation of application No. 16/636,858, filed as application No. PCT/CN2018/100272 on Aug. 13, 2018, now Pat. No. 11,296,658.

(30) Foreign Application Priority Data

Aug. 15, 2017 (WO) .............. PCT/CN2017/097521

(51) Int. Cl.
*H03F 1/30* (2006.01)
*H03F 1/32* (2006.01)
(Continued)

(52) U.S. Cl.
CPC ............. *H03F 1/3247* (2013.01); *H03F 1/30* (2013.01); *H03F 3/245* (2013.01);
(Continued)

(58) Field of Classification Search
CPC ......... H03F 1/30; H03F 1/3241; H03F 1/3247
(Continued)

(56) References Cited

U.S. PATENT DOCUMENTS

2006/0098758 A1  5/2006  Luke et al.
2009/0207935 A1* 8/2009  Behzad ............ H04L 25/03343
                                                375/296
(Continued)

FOREIGN PATENT DOCUMENTS

CN     101981880 A     2/2011
CN     102711229 A     10/2012
CN     206498380 U      9/2017

OTHER PUBLICATIONS

PCT Notification of Transmittal of the International Search Report and the Written Opinion of the International Searching Authority, or the Declaration issued for International application No. PCT/CN2018/100272—Sep. 25, 2018.
(Continued)

*Primary Examiner* — Henry Choe
(74) *Attorney, Agent, or Firm* — Baker Botts L.L.P.

(57) ABSTRACT

Device and method are disclosed for downlink gain compensation at a radio unit. According to an embodiment, the device comprises a pre-distortion circuit, a digital gain adjuster, a gain determiner and a first gain controller. The pre-distortion circuit is configured to generate and apply a pre-distortion to an input signal. The digital gain adjuster is configured to apply an adjustable gain to an output signal from the pre-distortion circuit. The gain determiner is configured to determine a gain difference between a target
(Continued)

downlink gain and current downlink gain. The first gain controller is configured to control the digital gain adjuster based on the gain difference. A radio unit comprising the device is also disclosed.

18 Claims, 5 Drawing Sheets

(51) Int. Cl.
    *H03F 3/24*     (2006.01)
    *H03G 3/30*     (2006.01)
    *H04B 1/16*     (2006.01)

(52) U.S. Cl.
    CPC ..... *H03G 3/3042* (2013.01); *H03F 2200/129* (2013.01); *H03F 2200/447* (2013.01); *H03F 2200/451* (2013.01); *H03G 2201/103* (2013.01); *H03G 2201/206* (2013.01); *H04B 1/16* (2013.01)

(58) Field of Classification Search
    USPC ........................................ 330/149; 455/114.3
    See application file for complete search history.

(56) References Cited

U.S. PATENT DOCUMENTS

2009/0285330 A1* 11/2009 Premakanthan ..... H03G 3/3047
                                                          375/297
2011/0201287 A1     8/2011   Pratt et al.

OTHER PUBLICATIONS

Exte Nde D European Search Repo Rt issued for Application No./Patent No. 18846883.9-1203 / 3669474 PCT/CN2018100272—Apr. 12, 2021.

* cited by examiner

US 12,301,173 B2

DEVICE AND METHOD FOR DOWNLINK GAIN COMPENSATION AS WELL AS RADIO UNIT COMPRISING THE DEVICE

PRIORITY

This application is a continuation, under 35 U.S.C. § 120, of U.S. patent application Ser. No. 16/636,858 filed on Feb. 5, 2020 which is a U.S. National Stage Filing under 35 U.S.C. § 371 of International Patent Application Serial No. PCT/CN2018/100272 filed Aug. 13, 2018 and entitled "DEVICE AND METHOD FOR DOWNLINK GAIN COMPENSATION AS WELL AS RADIO UNIT COMPRISING THE DEVICE" which claims priority to PCT/CN2017/097521 filed Aug. 15, 2017 both of which are hereby incorporated by reference in their entirety.

TECHNICAL FIELD

Embodiments of the disclosure generally relate to wireless communication, and more particularly, to a device and method for downlink gain compensation as well as a radio unit comprising the device.

BACKGROUND

Because the downlink gain of a radio unit (RU) may vary with factors such as temperature and frequency, it needs to be adjusted dynamically to implement a required target gain. FIG. 1 shows an existing solution for downlink gain compensation. As shown, an output radio frequency (RF) signal (denoted as Pout) from a power amplifier (PA) 102 is the outcome obtained by applying a series of processing to an input baseband signal (denoted as Pin). Note that some of the processings are omitted in FIG. 1 for brevity. In order to determine the current gain between the output and input signals, a receiver 104 (which may be called a transmission observation receiver (TOR) in this document for an illustration purpose), down coverts the output RF signal to a baseband or intermediate frequency (IF) signal (which may be called an observation signal for an illustration purpose) by, for example, a gain adjuster 1042 (which may be called TOR gain adjuster (TGA) for an illustration purpose), a RF downconverting mixer 1044, a bandpass filter 1046 and an analog to digital converter (ADC) 1048. Note that when taking the form of an IF signal, the observation signal is further converted to baseband by the digital section of the RU.

Then, a temperature/frequency compensation block 106 generates a correction signal according to the current temperature and frequency information provided from the TOR 104. The correction signal is added to the observation signal by a digital adder 108 to compensate gain and phase variations due to the current temperature and frequency. Then, a software (SW) 112, which is executed on the RU processor, obtains power values of the input signal and the corrected observation signal via power meters 110-1 and 110-2, respectively, so as to determine the current gain from the power values. Then, the SW 112 controls a voltage variable amplifier (VVA) 114 to compensate a gain difference between a target gain and the current gain.

For the above existing solution, there is still some room for improvement.

SUMMARY

This summary is provided to introduce a selection of concepts in a simplified form that are further described below in detailed description. This summary is not intended to identify key features or essential features of the claimed subject matter, nor is it intended to be used to limit the scope of the claimed subject matter.

One of the objects of the disclosure is to provide an improved solution for downlink gain compensation.

According to one aspect of the disclosure, there is provided a device for use in a radio unit (RU). The device comprises a pre-distortion circuit, a digital gain adjuster (GA), a gain determiner and a first gain controller. The pre-distortion circuit is configured to generate and apply a pre-distortion to an input signal. The digital GA is configured to apply an adjustable gain to an output signal from the pre-distortion circuit. The gain determiner is configured to determine a gain difference between a target downlink gain and current downlink gain. The first gain controller is configured to control the digital GA based on the gain difference.

In an embodiment of the disclosure, the RU comprises an analog GA and a second gain controller. The analog GA is configured to apply an adjustable gain to an output from the digital GA. The second gain controller is configured to perform a preliminary gain adjustment via the analog GA and then trigger the gain determiner to determine the gain difference.

In an embodiment of the disclosure, the first gain controller is further configured to control the analog GA via the second gain controller based on the gain difference.

In an embodiment of the disclosure, the RU comprises a power amplifier (PA) and an observation receiver. The PA is configured to amplify an output from the analog GA. The observation receiver is configured to process an output from the PA to feed back an observation signal to the pre-distortion circuit. The gain difference is determined from: a compensation gain corresponding to current working frequency and temperature; a power difference between the observation signal and the input signal received by the pre-distortion circuit; and residual gain and phase errors obtained from the pre-distortion circuit.

In an embodiment of the disclosure, the first gain controller is configured to control the digital GA by determining a first adjustment amount of the digital GA based on the gain difference. The first gain controller is configured to control the digital GA by determining a next gain of the digital GA based on the first adjustment amount and current applied gain of the digital GA. The first gain controller is configured to control the digital GA by configuring the next gain to the digital GA.

In an embodiment of the disclosure, the first gain controller is configured to determine the first adjustment amount by comparing the gain difference with a preset first adjustment step of the digital GA. The first gain controller is configured to determine the first adjustment amount by, when the gain difference is smaller than the first adjustment step, setting the first adjustment amount as the gain difference. The first gain controller is configured to determine the first adjustment amount by, when the gain difference is greater than or equals to the first adjustment step, setting the first adjustment amount as the first adjustment step.

In an embodiment of the disclosure, the first gain controller is configured to determine the next gain by comparing a first sum of the first adjustment amount and the current applied gain with an adjustment range of the digital GA. The first gain controller is configured to determine the next gain by, when the first sum is greater than an upper limit of the adjustment range, setting the next gain as a difference between the first adjustment amount and a second adjustment step of the analog GA. The first gain controller is configured to determine the next gain by, when the first sum is within the adjustment range, setting the next gain as the first sum. The first gain controller is configured to determine the next gain by, when the first sum is smaller than a lower limit of the adjustment range, setting the next gain as a second sum of the first adjustment amount and the second adjustment step.

In an embodiment of the disclosure, the first gain controller is configured to control the analog GA via the second gain controller by, when the first sum is greater than the upper limit of the adjustment range, setting a second adjustment amount of the analog GA as the second adjustment step. The first gain controller is configured to control the analog GA via the second gain controller by, when the first sum is smaller than the lower limit of the adjustment range, setting the second adjustment amount as an opposite value of the second adjustment step. The first gain controller is configured to control the analog GA via the second gain controller by configuring the second adjustment amount to the analog GA via the second gain controller.

According to another aspect of the disclosure, there is provided a method implemented at a device for use in a RU. The device comprises a pre-distortion circuit and a digital GA. The pre-distortion circuit is configured to generate and apply a pre-distortion to an input signal. The digital GA is configured to apply an adjustable gain to an output signal from the pre-distortion circuit. The method comprises determining a gain difference between a target downlink gain and current downlink gain. The method further comprises controlling the digital GA based on the gain difference.

In an embodiment of the disclosure, the RU comprises an analog GA and a second gain controller. The analog GA is configured to apply an adjustable gain to an output from the digital GA. The second gain controller is configured to perform a preliminary gain adjustment via the analog GA. The gain difference is determined in response to a trigger signal from the second gain controller.

In an embodiment of the disclosure, the method further comprises controlling the analog GA via the second gain controller based on the gain difference.

In an embodiment of the disclosure, controlling the digital GA comprises determining a first adjustment amount of the digital GA based on the gain difference. Controlling the digital GA further comprises determining a next gain of the digital GA based on the first adjustment amount and current applied gain of the digital GA. Controlling the digital GA further comprises configuring the next gain to the digital GA.

In an embodiment of the disclosure, determining the first adjustment amount comprises comparing the gain difference with a preset first adjustment step of the digital GA. Determining the first adjustment amount further comprises, when the gain difference is smaller than the first adjustment step, setting the first adjustment amount as the gain difference. Determining the first adjustment amount further comprises, when the gain difference is greater than or equals to the first adjustment step, setting the first adjustment amount as the first adjustment step.

In an embodiment of the disclosure, determining the next gain comprises comparing a first sum of the first adjustment amount and the current applied gain with an adjustment range of the digital GA. Determining the next gain further comprises, when the first sum is greater than an upper limit of the adjustment range, setting the next gain as a difference between the first adjustment amount and a second adjustment step of the analog GA. Determining the next gain further comprises, when the first sum is within the adjustment range, setting the next gain as the first sum. Determining the next gain further comprises, when the first sum is smaller than a lower limit of the adjustment range, setting the next gain as a second sum of the first adjustment amount and the second adjustment step.

In an embodiment of the disclosure, controlling the analog GA via the second gain controller comprises, when the first sum is greater than the upper limit of the adjustment range, setting a second adjustment amount of the analog GA as the second adjustment step. Controlling the analog GA via the second gain controller further comprises, when the first sum is smaller than the lower limit of the adjustment range, setting the second adjustment amount as an opposite value of the second adjustment step. Controlling the analog GA via the second gain controller further comprises configuring the second adjustment amount to the analog GA via the second gain controller.

According to another aspect of the disclosure, there is provided a device for use in a RU. The device comprises a pre-distortion circuit, a digital GA and a device controller. The pre-distortion circuit is configured to generate and apply a pre-distortion to an input signal. The digital GA is configured to apply an adjustable gain to an output signal from the pre-distortion circuit. The device controller comprises a processor and a memory. The memory contains instructions executable by the processor, whereby the device controller is operative to determine a gain difference between a target downlink gain and current downlink gain. The device controller is further operative to control the digital GA based on the gain difference.

In an embodiment of the disclosure, the device controller is operative to perform the method according to the above aspect.

According to another aspect of the disclosure, there is provided a RU comprising the device according to the above aspect.

According to another aspect of the disclosure, there is provided a computer program product. The computer program product comprises instructions which when executed by at least one processor, cause the at least one processor to perform the method according to the above aspect.

According to another aspect of the disclosure, there is provided a computer readable storage medium. The computer readable storage medium comprises instructions which when executed by at least one processor, cause the at least one processor to perform the method according to the above aspect.

These and other objects, features and advantages of the disclosure will become apparent from the following detailed description of illustrative embodiments thereof, which are to be read in connection with the accompanying drawings.

DETAILED DESCRIPTION

For the purpose of explanation, details are set forth in the following description in order to provide a thorough understanding of the embodiments disclosed. It is apparent, however, to those skilled in the art that the embodiments may be implemented without these specific details or with an equivalent arrangement.

Figure 1:
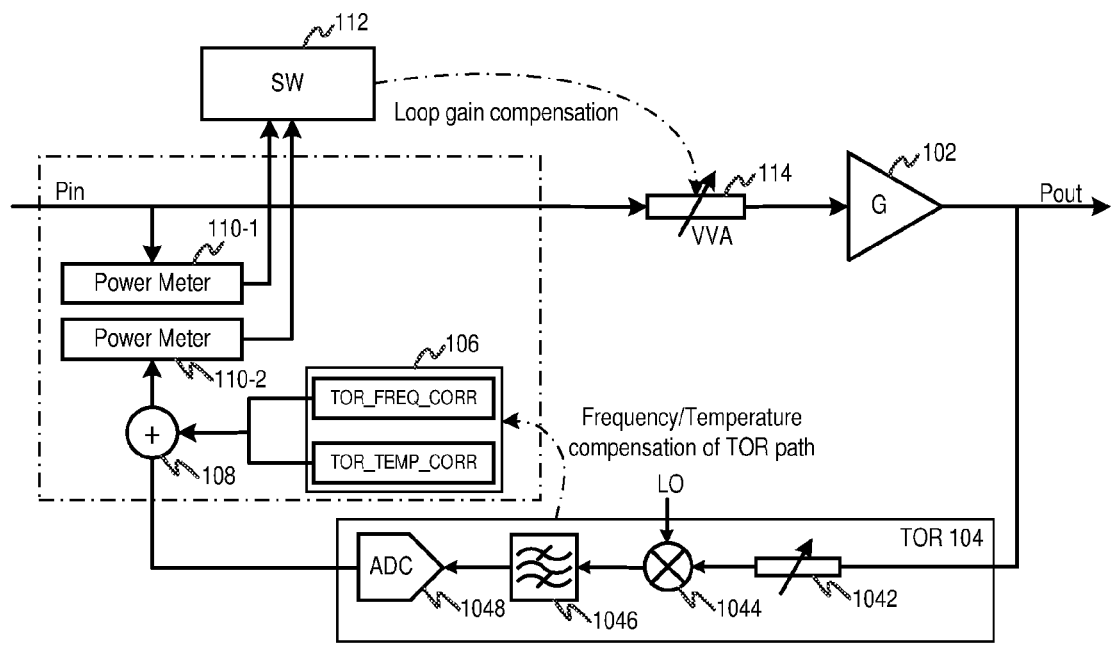
FIG. 1 shows an existing solution for downlink gain compensation.

The inventors of the disclosure found that the existing solution shown in FIG. 1 has some problems. Firstly, because the downlink gain compensation is performed by a software, the gain estimation and compensation period is relatively long (e.g., about 0.2 s), such that the gain compensation step is relatively big (e.g., 0.2 dB/0.5 dB).

Secondly, in a case where a digital pre-distortion (DPD) block is used for applying a pre-distortion to the input baseband signal to compensate the nonlinearity of the PA 102, because the SW 112 is independent from the DPD block, an error transition may occur in phase compensation/gain regulation (PC/GR) calculation performed by the DPD block. Specifically, the PC/GR calculation may have already converged under current loop gain/phase. Then, a new VVA adjustment may be performed to change the loop gain/phase. This will cause the PC/GR calculation to diverge.

Thirdly, the re-convergence of the PC/GR calculation will cause instability to the DPD block. Thereby, the instantaneous performance of the DPD block will be degraded.

The present disclosure proposes a solution for downlink gain compensation at a radio unit. Hereinafter, the solution will be described in detail with reference to FIGS. 2-8.

Figure 2:
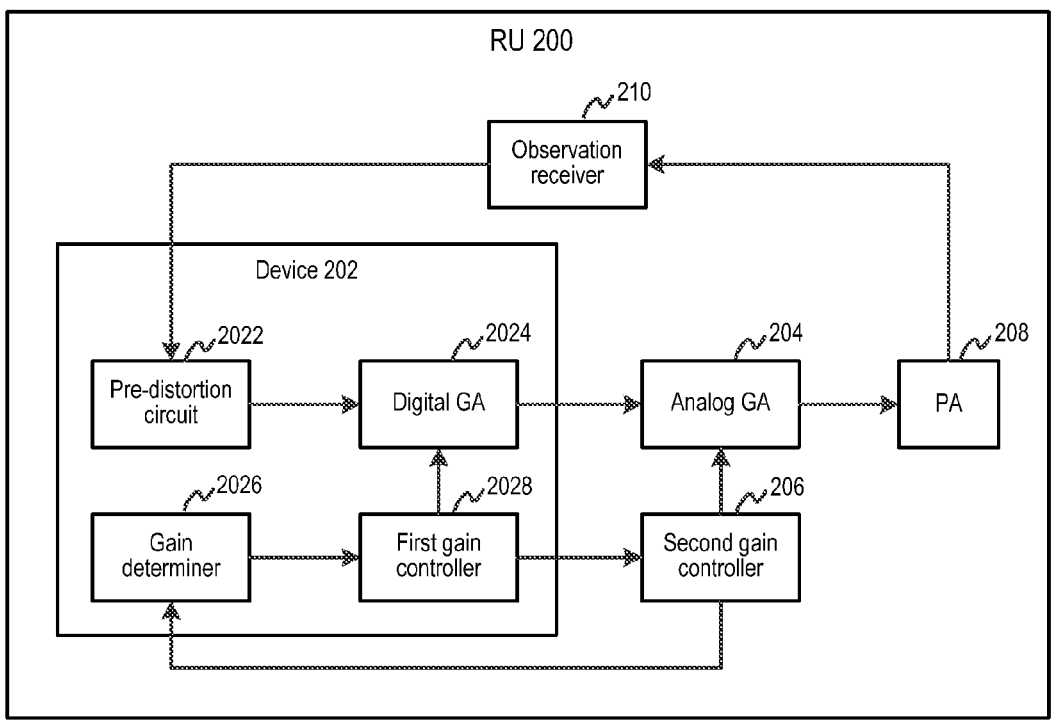
FIG. 2 is a block diagram showing a device and a radio unit according to an embodiment of the disclosure.

FIG. 2 is a block diagram showing a device and a radio unit according to an embodiment of the disclosure. As shown, the device 202 comprises a pre-distortion circuit 2022, a digital gain adjuster (GA) 2024, a gain determiner 2026 and a first gain controller 2028. The pre-distortion circuit 2022 is configured to generate and apply a pre-distortion to an input signal. The digital GA 2024 is configured to apply an adjustable gain to an output signal from the pre-distortion circuit 2022. The gain determiner 2026 is configured to determine a gain difference between a target downlink gain and current downlink gain. The first gain controller 2028 is configured to control the digital GA 2024 based on the gain difference.

The radio unit (RU) 200 comprises the device 202, an analog GA 204, a second gain controller 206, a power amplifier (PA) 208 and an observation receiver 210. The analog GA 204 is configured to apply an adjustable gain to an output from the digital GA 2024. The second gain controller 206 is configured to perform a preliminary gain adjustment via the analog GA 204 and then trigger the gain determiner 2026 to determine the gain difference. The second gain controller 206 may be further configured to control the analog GA 204 according to the instruction from the first gain controller 2028. In other words, the first gain controller 2028 may be further configured to control the analog GA 204 via the second gain controller 206 based on the gain difference. The PA 208 is configured to amplify an output from the analog GA 204. The observation receiver 210 is configured to process an output from the PA 208 to feed back an observation signal to the pre-distortion circuit 2022. The implementing details of the above components 202-210 in the RU 200 will be described below.

In order to compensate the nonlinearity of the PA 208, the pre-distortion circuit 2022 may be implemented, for example, based on various DPD technologies. In some embodiments of the present disclosure, residual gain and phase errors can be obtained from the pre-distortion circuit 2022.

The digital GA 2024 may be implemented as, for example, a digital multiplier. It may have a preset first adjustment step. The gain determiner 2026 may be implemented by using, for example, digital signal processor (DSP) and/or (FPGA). It may determine the gain difference according to the following information:
- a compensation gain corresponding to current working frequency and temperature;
- the power difference between the observation signal and the input signal received by the pre-distortion circuit 2022; and
- residual gain and phase errors obtained from the pre-distortion circuit 2022.

The current working frequency and temperature values may be provided from the observation receiver 210. The gain determiner 2026 may determine the compensation gain based on the information from a database which may be passed to the gain determiner 2026 through a shared memory by the second gain controller 206. The database may store the compensation gain in association with temperature and frequency values.

The power difference between the observation signal and the input signal may be taken as a coarse gain estimate. Then, a coarse gain difference estimate may be calculated as the difference between a target downlink gain and the coarse gain estimate. In addition, each of the residual gain and phase errors may be taken as a fine gain difference estimate. Thus, the total gain difference may be constituted by the compensation gain, the coarse gain difference estimate and the fine gain difference estimates.

The analog GA 204 may be implemented as, for example, a VVA that is included in an in-phase and quadrature (IQ) modulator. It may have a second adjustment step. The second adjustment step may be greater than the first adjustment step of the digital GA 2024. In this way, a coarse gain compensation may be performed via the analog GA 204, while a fine gain compensation may be performed via the digital GA 2024. Thus, the gain adjustment can be more accurate than the existing solution.

The PA 208 may be implemented as any suitable amplifier for amplifying RF signals. The observation receiver 210 may include, for example, a VVA, a RF downconverting mixer, a bandpass filter and an ADC.

The first gain controller 2028 may be implemented by using, for example, digital signal processor (DSP) and/or (FPGA). The second gain controller 206 may be implemented by executing an application software on a processor of the RU 200. Hereinafter, the operations performed by the first gain controller 2028 and the second gain controller 206 will be described in detail.

Firstly, the second gain controller 206 performs a preliminary gain adjustment via the analog GA 204. For example, after carrier setup, the second gain controller 206 may control the analog GA 204 to apply at least a predetermined gain. Suppose $G_{target}$ denotes the target downlink gain and $G_{PA}$ denotes the gain applied by the PA 208, such as 1.5 dB. Then, the predetermined gain may equal to $(G_{target} - G_{PA})$.

For example, the second gain controller 206 may monitor the output and input of the analog GA 204 when controlling the analog GA 204 to adjust its applied gain. Once the applied gain of the analog GA 204 is greater than or equals to the predetermined gain, the second gain controller 206 may stop the preliminary gain adjustment (that is, the applied gain of the analog GA 204 is maintained) and trigger the gain determiner 2026 to determine the gain difference. In this way, a subsequent gain adjustment can be triggered.

In the subsequent gain adjustment, the gain determiner 2026 determines the gain difference between the target downlink gain and current downlink gain. The first gain controller 2028 controls the digital GA 2024 based on the gain difference. The first gain controller 2028 may further control the analog GA 204 via the second gain controller 206 based on the gain difference. Since the fine gain adjustment is implemented by the hardware 2026 and 2028, the gain adjustment can be faster than the existing solution.

Figure 3:
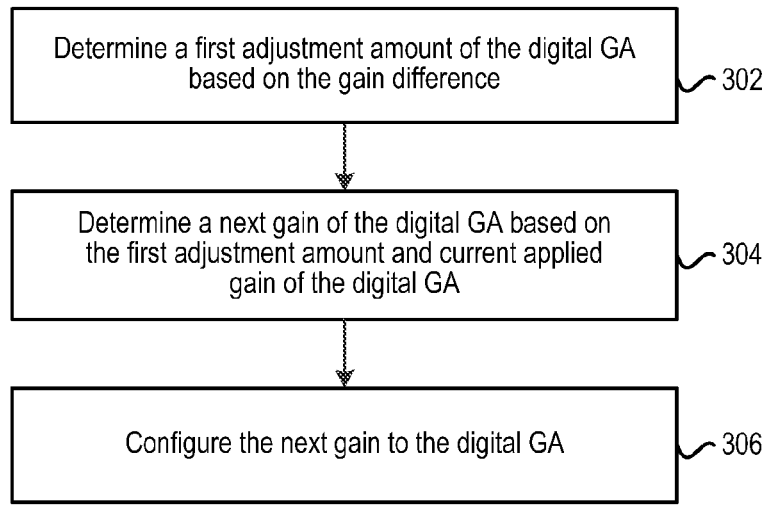
FIG. 3 is a flowchart illustrating a method implemented at the device according to an embodiment of the disclosure.

FIG. 3 shows an example about how the first gain controller 2028 controls the digital GA 2024. As shown, at step 302, a first adjustment amount of the digital GA 2024 is determined based on the gain difference. This step may be implemented as steps 408-412 of FIG. 4, which will be described later.

At step 304, a next gain of the digital GA 2024 is determined based on the first adjustment amount and current applied gain of the digital GA. This step may be implemented as steps 514-520 of FIG. 5, which will be described later.

At step 306, the next gain is configured to the digital GA 2024. The pre-distortion circuit 2022 may be controlled to stop working when the next gain is configured to the digital GA 2024 and the current pre-distortion processing is finished. In this way, the instability of the pre-distortion circuit 2022 may be avoided as possible.

Optionally, before the determination of step 302, the first gain controller may compare the gain difference with a first predetermined threshold and a second predetermined threshold, respectively. The second threshold may be greater than the first threshold.

Then, if the gain difference is below the first threshold (e.g., 1.7 dB), step 302 may be performed. If the gain difference is above the first threshold and below the second threshold (e.g., 3 dB), the pre-distortion circuit may be reset and then the preliminary gain adjustment may be performed again. If the gain difference is above the second threshold, the preliminary gain adjustment may be performed again.

Figure 4:
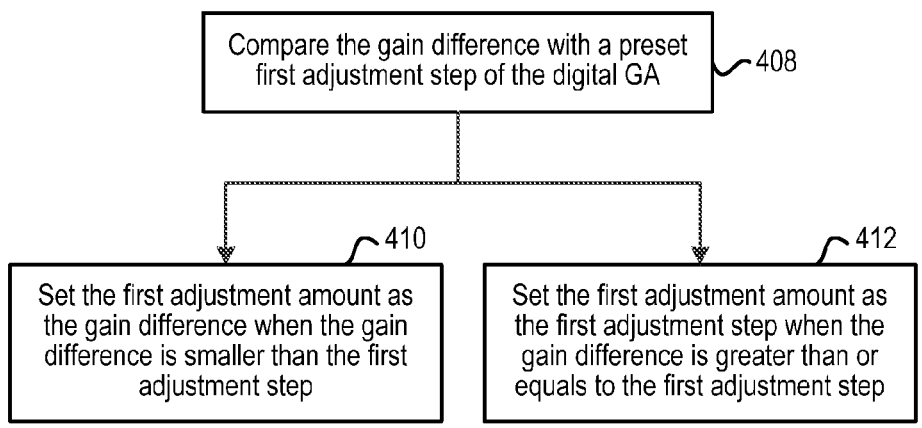
FIG. 4 is a flowchart for explaining the method of FIG. 3.

FIG. 4 shows an example about how the first adjustment amount of the digital GA 2024 may be determined. As shown, at step 408, the gain difference is compared with the preset first adjustment step of the digital GA 2024. Then, if the gain difference is smaller than the first adjustment step, the first adjustment amount is set as the gain difference at step 410. On the other hand, if the gain difference is greater than or equals to the first adjustment step, the first adjustment amount is set as the first adjustment step at step 412.

In this way, the first adjustment amount to be applied by the digital GA 2024 is below the preset first adjustment step. Since the first adjustment step may be smaller than the second adjustment step of the analog GA 204, a fine gain adjustment can be performed via the digital GA 2024.

Figure 5:
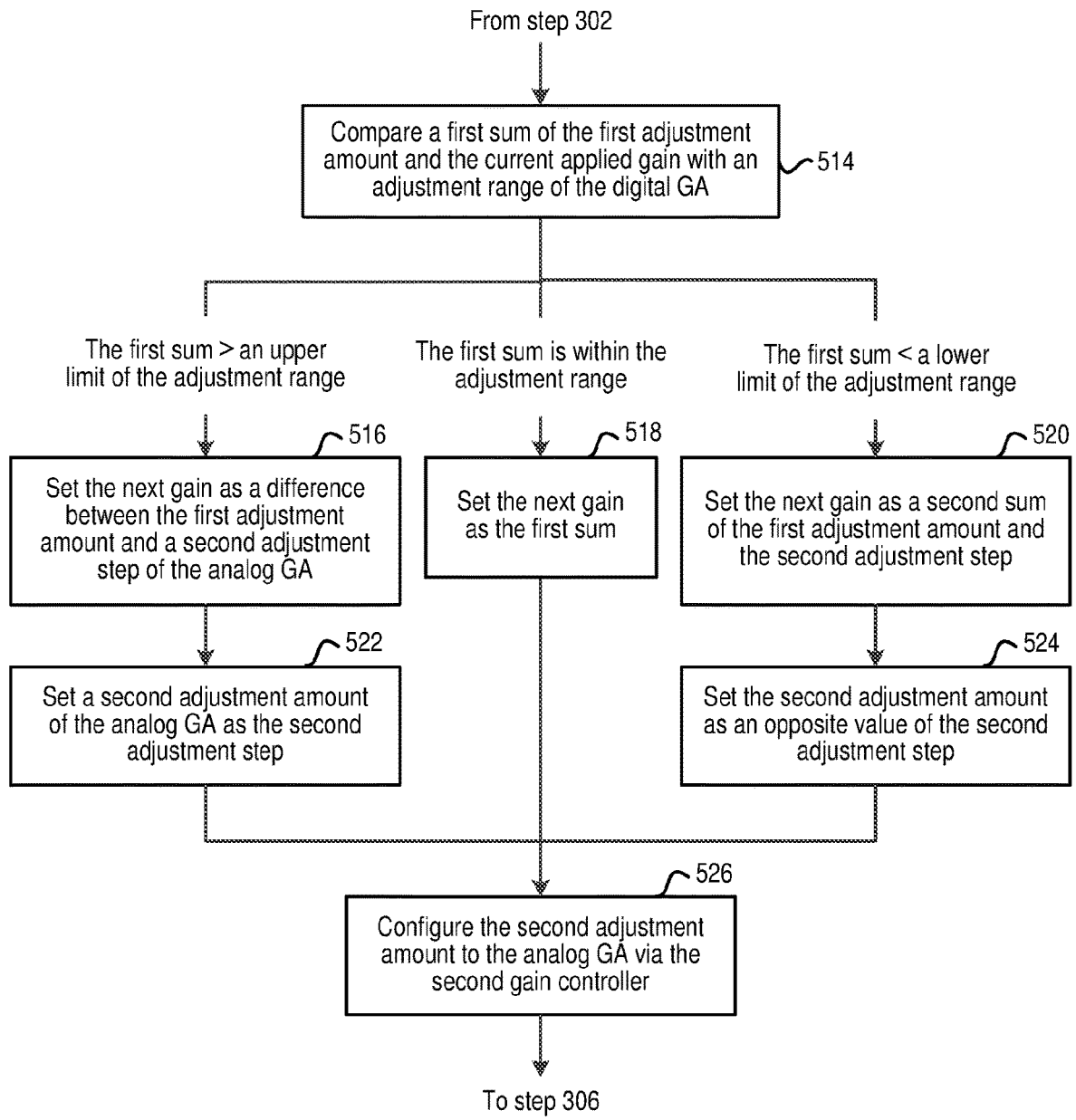
FIG. 5 is another flowchart for explaining the method of FIG. 3.

FIG. 5 shows an example about how the first gain controller 2028 controls the digital GA 2024 and the analog GA 2026. As shown, after the determination of step 302, a first sum of the first adjustment amount and the current applied gain of the digital GA 2024 is compared with an adjustment range of the digital GA 2024 at step 514.

If the first sum is greater than an upper limit of the adjustment range, the next gain is set at step 516 as a difference between the first adjustment amount and the second adjustment step of the analog GA 204. Correspondingly, a second adjustment amount of the analog GA 204 is set at step 522 as the second adjustment step. In this way, the first adjustment amount can be achieved via both the digital GA 2024 and the analog GA 204.

If the first sum is within the adjustment range, the next gain is set as the first sum at step 518. In this case, the first adjustment amount can be achieved via only the digital GA 2024, without requiring the analog GA 204 to adjust its applied gain.

If the first sum is smaller than a lower limit of the adjustment range, the next gain is set at step 520 as a second sum of the first adjustment amount and the second adjustment step. Correspondingly, the second adjustment amount is set at step 524 as an opposite value of the second adjustment step. In this way, the first adjustment amount can be achieved via both the digital GA 2024 and the analog GA 204.

Then, at step 526, the second adjustment amount is configured to the analog GA 204 via the second gain controller 206. The pre-distortion circuit 2022 may be controlled to stop working when the second adjustment amount is configured to the analog GA 204 and the current pre-distortion processing is finished. Then, at step 306, the next gain is configured to the digital GA 2024.

Although it is shown in FIG. 5 that step 522 is subsequent to step 516, step 524 is subsequent to step 520 and step 306 is subsequent to step 526, it is also possible that in each of these three step groups, one step is performed simultaneously with or prior to the other step.

For example, suppose the first adjustment step ST1 of the digital GA (denoted as GA1) is 0.2 dB, the first adjustment range is [GA$1_{min}$, GA$1_{max}$]=[0 dB, 0.5 dB], and the second adjustment step ST2 of the analog GA (denoted as GA2) is 0.5 dB. Then, if the gain difference $G_{diff}$ is 0.8 dB and current applied gain (denoted as $G_{GA1}$) of the digital GA is 0.4 dB, the first gain adjustment amount Δ1 may be determined as ST1=0.2 dB since $G_{diff}$>ST1. Further, since $G_{GA1}$+Δ1=0.6 dB>GA$1_{max}$, the next gain $G'_{GA1}$ may be determined as Δ1−ST2=−0.3 dB. The second gain adjustment Δ2 may be determined as ST2=0.5 dB. That is, $G_{GA1}$ will be decreased by 0.3 dB and current applied gain (denoted as $G_{GA2}$) of the analog GA will be increased by 0.5 dB. As a result, the total gain adjustment amount is 0.5 dB−0.3 dB=0.2 dB.

For another example, if $G_{diff}$ is −0.5 dB and $G_{GA1}$ is 0.1 dB, Δ1 may be determined as −0.2 dB since $|G_{diff}|$>ST1. Further, since $G_{GA}$+Δ1=−0.1 dB<GA$1_{min}$, $G'_{GA1}$ may be determined as Δ1+ST2=0.3 dB. The second gain adjustment Δ2 may be determined as −ST2=−0.5 dB. That is, $G_{GA1}$ will be increased by 0.3 dB and $G_{GA2}$ will be decreased by 0.5 dB. As a result, the total gain adjustment amount is 0.3 dB−0.5 dB=−0.2 dB.

Optionally, before the second gain controller 206 controls the analog GA 204 according to the instruction from the first gain controller 2024, the second gain controller 206 may determine whether a sum of the second adjustment amount and current applied gain of the analog GA 204 is too high or too low.

If the sum is too high or too low, the second gain controller 206 may send out an alarm. On the other hand, if the sum is neither too high nor too low, the second gain controller 206 may configure the second adjustment amount to the analog GA 204.

Figure 6:
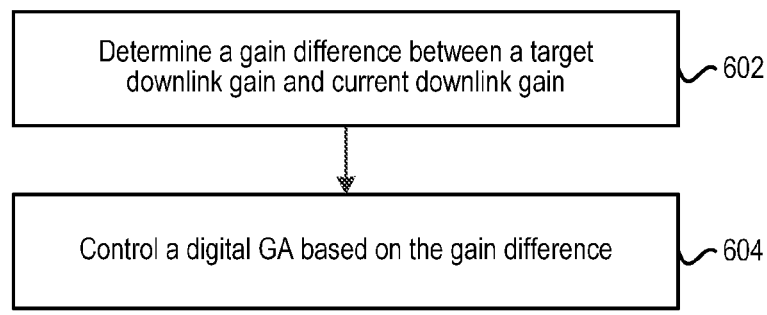
FIG. 6 is a flowchart illustrating a method implemented at a device according to another embodiment of the disclosure.

FIG. 6 is a flowchart illustrating a method implemented at a device according to another embodiment of the disclosure. The device comprises a pre-distortion circuit configured to generate and apply a pre-distortion to an input signal, and a digital GA configured to apply an adjustable gain to an output signal from the pre-distortion circuit. The method may be performed by a processor and a memory of the device.

At step 602, it is determined a gain difference between a target downlink gain and current downlink gain. This step may be implemented as described above with respect to the gain determiner 2026. Then, at step 604, the digital GA is controlled based on the gain difference. This step may be implemented as described above with respect to the first gain controller 2028.

Figure 7:
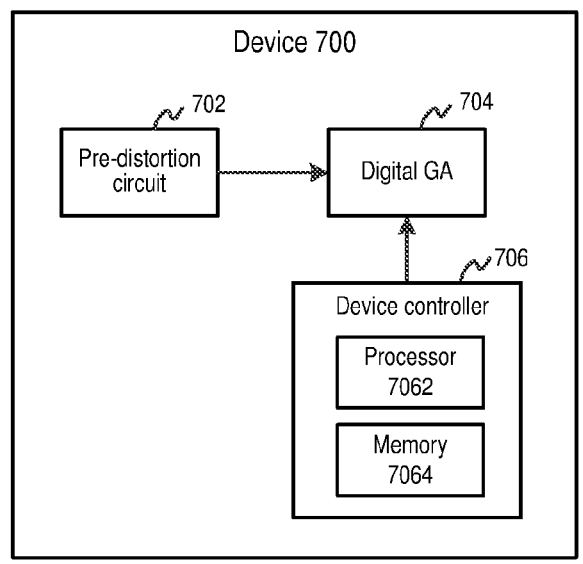
FIG. 7 is a block diagram showing a device according to another embodiment of the disclosure.

FIG. 7 is a block diagram showing a device according to another embodiment of the disclosure. This embodiment is similar to the embodiment of FIG. 2 except that the hardware (the gain determiner 2026 and the first gain controller 2028) is replaced with a device controller mainly implemented by software. Specifically, the device 700 comprises a pre-distortion circuit 702 configured to generate and apply a pre-distortion to an input signal, a digital GA 704 configured to apply an adjustable gain to an output signal from the pre-distortion circuit, and a device controller 706. The device controller 706 comprises a processor 7062 and a memory 7064. The memory 7064 contains instructions which may be executed by the processor 7062 to cause the device controller 706 to perform the method steps described above with reference to FIGS. 3-6.

Figure 8:
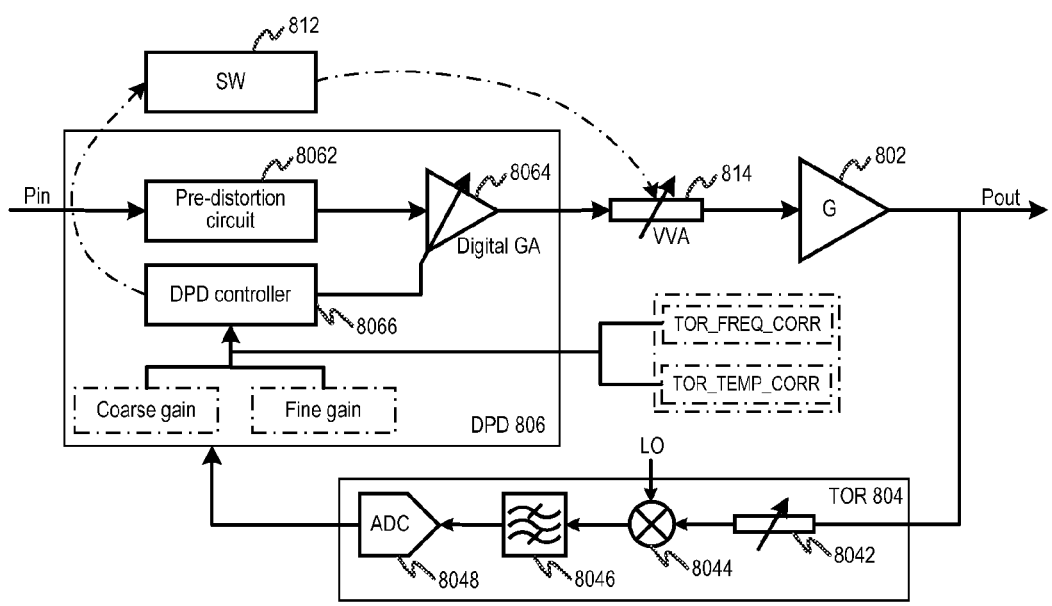
FIG. 8 shows a solution for downlink gain compensation according to an embodiment of the disclosure.

FIG. 8 shows a solution for downlink gain compensation according to an embodiment of the disclosure. This embodiment is an exemplary example of the embodiment shown in FIG. 7. In this example, the device is implemented as a DPD device 806 and the second gain controller is implemented as a software (SW) 812 executed on the RU processor. The other components (the VVA 814, the PA 802, the TOR 804) may be implemented as described above with reference to FIG. 2. Alternatively, the DPD controller 8066 may be replaced with the hardware 2026 and 2028 as described above.

In this way, a DPD based gain compensation solution can be provided. In this solution, the DPD device tracks the gain difference and compensates the gain difference via its own "power amplifier"—the digital GA 8064. In case the gain difference exceeds the capability of the digital GA 8064 (typically with an adjustment range of 0–0.5 dB), the DPD device 806 may inform the SW 812 to adjust the analog VVA 814.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the disclosure is not limited thereto. While various aspects of the exemplary embodiments of this disclosure may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the disclosure may be practiced in various components such as integrated circuit chips and modules. It should thus be appreciated that the exemplary embodiments of this disclosure may be realized in an apparatus that is embodied as an integrated circuit, where the integrated circuit may comprise circuitry (as well as possibly firmware) for embodying at least one or more of a data processor, a digital signal processor, baseband circuitry and radio frequency circuitry that are configurable so as to operate in accordance with the exemplary embodiments of this disclosure.

It should be appreciated that at least some aspects of the exemplary embodiments of the disclosure may be embodied in computer-executable instructions, such as in one or more program modules, executed by one or more computers or other devices. Generally, program modules include routines, programs, objects, components, data structures, etc. that perform particular tasks or implement particular abstract data types when executed by a processor in a computer or other device. The computer executable instructions may be stored on a computer readable medium such as a hard disk, optical disk, removable storage media, solid state memory, RAM, etc. As will be appreciated by one of skill in the art, the function of the program modules may be combined or distributed as desired in various embodiments. In addition, the function may be embodied in whole or in part in firmware or hardware equivalents such as integrated circuits, field programmable gate arrays (FPGA), and the like.

References in the present disclosure to "one embodiment", "an embodiment" and so on, indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

It should be understood that, although the terms "first", "second" and so on may be used herein to describe various elements, these elements should not be limited by these terms. These terms are only used to distinguish one element from another. For example, a first element could be termed a second element, and similarly, a second element could be termed a first element, without departing from the scope of the disclosure. As used herein, the term "and/or" includes any and all combinations of one or more of the associated listed terms.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components, but do not preclude the presence or addition of one or more other features, elements, components and/or combinations thereof.

The present disclosure includes any novel feature or combination of features disclosed herein either explicitly or any generalization thereof. Various modifications and adaptations to the foregoing exemplary embodiments of this disclosure may become apparent to those skilled in the relevant arts in view of the foregoing description, when read in conjunction with the accompanying drawings. However, any and all modifications will still fall within the scope of the non-Limiting and exemplary embodiments of this disclosure.

What is claimed is:

1. A device for use in a radio unit, RU, the device comprising:
    a pre-distortion circuit configured to generate and apply a pre-distortion to an input signal;
    a digital gain adjuster (GA) configured to apply an adjustable gain to an output signal from the pre-distortion circuit;
    a gain determiner configured to determine a gain difference between a target downlink gain and current downlink gain; and
    a first gain controller configured to control the digital GA based on the gain difference wherein the RU comprises an analog GA configured to apply an adjustable gain to an output from the digital GA and a second gain controller configured to perform a preliminary gain adjustment via the analog GA and then trigger the gain determiner to determine the gain difference.

2. The device according to claim 1, wherein the first gain controller is further configured to control the analog GA via the second gain controller based on the gain difference.

3. The device according to claim 1, wherein the RU comprises:
    a power amplifier (PA) configured to amplify an output from the analog GA; and
    an observation receiver configured to process an output from the PA to feed back an observation signal to the pre-distortion circuit; and
    wherein the gain difference is determined from:
    a compensation gain corresponding to current working frequency and temperature;
    a power difference between the observation signal and the input signal received by the pre-distortion circuit; and
    residual gain and phase errors obtained from the pre-distortion circuit.

4. The device according to claim 2, wherein the first gain controller (2028) is configured to control the digital GA by:
    determining a first adjustment amount of the digital GA based on the gain difference;
    determining a next gain of the digital GA based on the first adjustment amount and current applied gain of the digital GA; and
    configuring the next gain to the digital GA.

5. The device according to claim 4, wherein the first gain controller is configured to determine the first adjustment amount by:
    comparing the gain difference with a preset first adjustment step of the digital GA;
    when the gain difference is smaller than the first adjustment step, setting the first adjustment amount as the gain difference; and
    when the gain difference is greater than or equals to the first adjustment step, setting the first adjustment amount as the first adjustment step.

6. The device according to claim 4, wherein the first gain controller is configured to determine the next gain by:
    comparing a first sum of the first adjustment amount and the current applied gain with an adjustment range of the digital GA;
    when the first sum is greater than an upper limit of the adjustment range, setting the next gain as a difference between the first adjustment amount and a second adjustment step of the analog GA;
    when the first sum is within the adjustment range, setting the next gain as the first sum; and
    when the first sum is smaller than a lower limit of the adjustment range, setting the next gain as a second sum of the first adjustment amount and the second adjustment step.

7. The device according to claim 6, wherein the first gain controller is configured to control the analog GA via the second gain controller by:
    when the first sum is greater than the upper limit of the adjustment range, setting a second adjustment amount of the analog GA as the second adjustment step;
    when the first sum is smaller than the lower limit of the adjustment range, setting the second adjustment amount as an opposite value of the second adjustment step; and
    configuring the second adjustment amount to the analog GA via the second gain controller.

8. A method implemented at a device for use in a radio unit (RU), wherein the device comprises a pre-distortion circuit configured to generate and apply a pre-distortion to an input signal, and a digital gain adjuster (GA), configured to apply an adjustable gain to an output signal from the pre-distortion circuit, the method comprising:
    determining a gain difference between a target downlink gain and current downlink gain; and
    controlling the digital GA based on the gain difference wherein the RU comprises an analog GA configured to apply an adjustable gain to an output from the digital GA and a second gain controller configured to perform a preliminary gain adjustment via the analog GA and wherein the gain difference is determined in response to a trigger signal from the second gain controller.

9. The method according to claim 8, further comprising:
    controlling the analog GA via the second gain controller based on the gain difference.

10. The method according to claim 8, wherein the RU comprises:
    a power amplifier (PA), configured to amplify an output from the analog GA; and
    an observation receiver configured to process an output from the PA to feed back an observation signal to the pre-distortion circuit; and
    wherein the gain difference is determined from:
    a compensation gain corresponding to current working frequency and temperature;
    a power difference between the observation signal and the input signal received by the pre-distortion circuit; and
    residual gain and phase errors obtained from the pre-distortion circuit.

11. The method according to claim 9, wherein controlling the digital GA comprises:
    determining a first adjustment amount of the digital GA based on the gain difference;
    determining a next gain of the digital GA based on the first adjustment amount and current applied gain of the digital GA; and
    configuring the next gain to the digital GA.

12. The method according to claim 11, wherein determining the first adjustment amount comprises:
    comparing the gain difference with a preset first adjustment step of the digital GA;
    when the gain difference is smaller than the first adjustment step, setting the first adjustment amount as the gain difference; and
    when the gain difference is greater than or equals to the first adjustment step, setting the first adjustment amount as the first adjustment step.

13. The method according to claim 11, wherein determining the next gain comprises:
comparing a first sum of the first adjustment amount and the current applied gain with an adjustment range of the digital GA;
when the first sum is greater than an upper limit of the adjustment range, setting the next gain as a difference between the first adjustment amount and a second adjustment step of the analog GA;
when the first sum is within the adjustment range, setting the next gain as the first sum; and
when the first sum is smaller than a lower limit of the adjustment range, setting the next gain as a second sum of the first adjustment amount and the second adjustment step.

14. The method according to claim 13, wherein controlling the analog GA via the second gain controller comprises:
when the first sum is greater than the upper limit of the adjustment range, setting a second adjustment amount of the analog GA as the second adjustment step;
when the first sum is smaller than the lower limit of the adjustment range, setting the second adjustment amount as an opposite value of the second adjustment step; and
configuring the second adjustment amount to the analog GA via the second gain controller.

15. A device for use in a radio unit (RU), the device comprising:
a pre-distortion circuit configured to generate and apply a pre-distortion to an input signal;
a digital gain adjuster (GA), configured to apply an adjustable gain to an output signal from the pre-distortion circuit;
a device controller comprising a processor and a memory, the memory containing instructions executable by the processor, whereby the device controller is operative to:
determine a gain difference between a target downlink gain and current downlink gain; and
control the digital GA based on the gain difference
wherein the RU comprises an analog GA configured to apply an adjustable gain to an output from the digital GA and a second gain controller configured to perform a preliminary gain adjustment via the analog GA and then trigger the gain determiner to determine the gain difference.

16. A radio unit (RU), comprising the device to claim 1.

17. A radio unit (RU), comprising the device to claim 15.

18. A computer program product comprising instructions which when executed by at least one processor, cause the at least one processor to perform the method according to claim 8.

* * * * *